United States Patent [19]

Turski et al.

[11] 4,085,377
[45] Apr. 18, 1978

[54] MICROWAVE FREQUENCY DISCRIMINATOR COMPRISING A ONE PORT ACTIVE DEVICE

[75] Inventors: Zygmond Turski, Selden, N.Y.; Arye Rosen, Cherry Hill, N.J.

[73] Assignee: RCA Corporation, New York, N.Y.

[21] Appl. No.: 722,829

[22] Filed: Sep. 13, 1976

[51] Int. Cl.² .............................................. H03D 3/26
[52] U.S. Cl. ............................... 329/116; 307/233 R; 328/140; 329/119; 329/134; 329/192; 329/205 R; 330/5; 330/53
[58] Field of Search ............... 329/103, 116, 119, 134, 329/205 R, 206, 192; 307/233 R; 328/140; 330/34, 5, 53

[56] References Cited

U.S. PATENT DOCUMENTS

| | | | |
|---|---|---|---|
| 3,163,826 | 12/1964 | Kemper | 329/119 X |
| 3,466,563 | 9/1969 | Thim | 330/34 |
| 3,975,699 | 8/1976 | Van Anda et al. | 328/140 X |
| 4,005,372 | 1/1977 | Ho et al. | 330/34 |

Primary Examiner—Siegfried H. Grimm
Attorney, Agent, or Firm—H. Christoffersen; Joseph D. Lazar; Robert M. Rodrick

[57] ABSTRACT

A microwave frequency discriminator using a one port active device amplifier including a circulator for coupling an input RF signal of substantially constant power level into the amplifier and an output RF signal out from the amplifier. The discriminator further comprises input and output matching networks connected to the circulator and a detector for generating a D.C. signal as a function of the incoming signal frequency. The input and output impedance matching networks are formed to provide selected impedance conditions to the amplifier such that the power-frequency response of the amplifier varies substantially linearly approximating a frequency discriminator characteristic throughout a predetermined frequency bandwidth.

8 Claims, 3 Drawing Figures

MICROWAVE FREQUENCY DISCRIMINATOR COMPRISING A ONE PORT ACTIVE DEVICE

The Government has rights in this invention pursuant to Contract No. N00039-74-C-0227, awarded by the Department of the Navy.

CROSS REFERENCE TO RELATED APPLICATIONS

Of interest are the following copending applications: Ser. No. 714,356 (RCA 70,075) filed Aug. 16, 1976, entitled, "Microwave Frequency Discriminator, " Ser. No. 722,585 (RCA 70,204) filed on even date herewith, entitled, "Microwave Frequency Discriminator Comprising An FET Amplifier," both based on the inventions of Daniel David Mawhinney and Zygmond Turski; Ser. No. 722,582 (RCA 70,994) filed on even date herewith, entitled, "Improved Microwave Frequency Discriminator Comprising An FET Amplifier", based on the invention of Arye Rosen and Louis Sebastian Napoli, all assigned to the same assignee as is the present invention.

BACKGROUND OF THE INVENTION

1. Field of the Invention

This invention relates to a microwave frequency discriminator and more particularly to a discriminator comprising a one port active device.

2. Description of the Prior Art

Techniques and devices for the rapid and accurate determination of an unknown signal frequency are of significant interest in modern communication systems, in particular, for electronic counter measure (ECM) systems operating at microwave frequencies. Microwave frequency discriminators capable of converting incoming unknown frequencies into voltages adequate for processing are often used in ECM systems. A microwave frequency discriminator may be defined as a circuit that provides an output voltage which is a predetermined function of and usually proportional to the frequency of an incoming signal. The discriminator voltage output versus frequency response, commonly termed the "discriminator characteristic" is the response in which the output voltage varies nearly linearly with respect to frequency over a predetermined frequency bandwidth. The bandwidth is generally determined by the slope, linearity, and resolution of the discriminator and is the frequency range over which the discriminator provides an unamibguous voltage output which is related to the input frequency.

A typical prior art broadband microwave discriminator utilizes passive elements such as transmission lines or an arrangement of lumped elements to vary the power level of the input signal applied to a detector diode as a function of frequency. Such a discriminator formed of various passive components generally, disadvantageously, has a large number of connections between the components. Such interconnections of the components within the discriminator often produce impedance mismatches resulting in undesirable inflection points in the relation between input frequency and output voltage such that a certain voltage can occur at several frequencies. Such distortions in the discriminator characteristic curve limit the broadband resolution of the discriminator minimizing thereby the accuracy of the system.

Most prior art discriminators are preceded with a limiter to provide a constant power input to the discriminator, whereby the output voltage of the discriminator is a function of frequency alone. Limiters may not be required, however, if the incoming signal has a relatively constant magnitude. Since such a prior art passive discriminator network has no gain, the voltage output which it can produce is restricted by the power available from the limiter preceding the discriminator. The overall linearity and usable bandwidth of the discriminator is also restricted by the frequency response and uniformity characteristics of each of the many elements of such a passive discriminator. In addition, the numerous interconnections in the passive discriminator produce multiple wave reflections which cause distortions of the frequency-voltage discriminator characteristic which reduce the accuracy and usable frequency range of the discriminator.

SUMMARY OF THE INVENTION

According to the present invention, a microwave frequency discriminator comprises a one port active device amplifier including an active device. The active device is biased an amount for generating an output RF signal within a predetermined frequency bandwidth in response to an input RF signal of substantially constant power level. Included in the discriminator is means for coupling the input RF signal into the amplifier and for coupling the output RF signal out from the amplifier. Input and output impedance matching networks are connected to the coupling means. The input and output matching networks are formed to provide selected input and output impedance conditions to the amplifier such that the power of the output RF signal varies substantially linearly with the frequency of the input RF signal throughout the frequency bandwidth. A detector responsive to the output RF signal generates a D.C. signal varying substantially linearly as a function of the frequency of the input RF signal.

In an environment of a wide band input RF signal of varying power level, limiter means may be used to provide an RF signal of substantially constant power level to the amplifier.

DETAILED DESCRIPTION OF THE PREFERRED EMBODIMENTS

Figure 1:
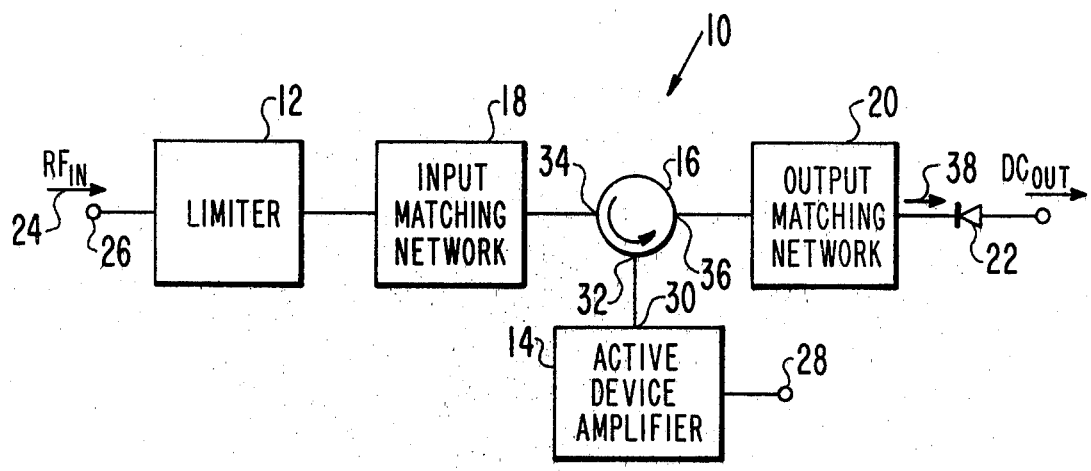
FIG. 1 is a schematic representation of a microwave frequency discriminator of the present invention.

Referring to the drawing, there is shown in FIG. 1 a schematic diagram of a microwave discriminator 10 according to one embodiment of the present invention. Discriminator 10 includes a limiter 12, a one port active device amplifier 14, a three port circulator 16, input impedance matching network 18, output impedance matching network 20 and a detector diode 22.

An input RF signal 24 of unknown frequency, which may be of variable power level, is applied to the input 26 and processed by limiter 12. The function of limiter 12 is to provide an output RF signal having a predetermined power level which is invariant with the power level and frequency of the incoming signal, so that it may be processed as described hereinafter. It should be understood that limiter 12 may be unnecessary and eliminated if the incoming RF signal 24 has a relatively constant power level.

Active device amplifier 14 includes an active device which may be, for example, a tunnel diode, IMPATT diode, TRAPATT diode, or transferred electron amplifier (TEA). The active device is biased an amount by a suitable bias voltage as by bias terminal 28, terminal 28 being connected to a voltage source (not shown) to achieve a negative resistance of the active device and amplification of RF signals applied to active device amplifier 14. Such active devices are desirable in the application of the present invention as a microwave frequency discriminator since high microwave frequency bands, i.e., above 18 GHz, can be achieved with these one port active devices. In particular, transferred electron amplifiers (TEA) can be used in the frequency range of 40–60 GHz.

Active device amplifier 14 has a single port 30 which is electrically connected to a coupling port 32 of circulator 16. Input port 34 of circulator 16 is electrically connected to input matching network 18, input matching network 18 being connected to limiter 12 to receive the limited incoming RF signal. Output port 36 of circulator 16 is electrically connected to output matching network 20, output matching network 20 being connected to detector diode 22. The limited RF signal is applied via input matching network 18 to the input port 34 of circulator 16.

A circulator is a high frequency device of a type which directs electromagnetic input power therethrough in a non-reciprocal manner and which operates in a manner of a turnstile turning in the direction of the arrow shown and having ports distributed about its circumference. (See U.S. Pat. No. 3,456,213, issued on July 15, 1969, for a detailed description of a circulator.) Consequently, the input signal applied at the input port 34 will exit at the coupling port 32. This signal is applied through port 30 to active amplifier 14. Amplifier 14 amplifies the applied signal and the amplified signals are fed back through port 30 to circulator 16 through coupling port 32. Consequently, the amplified signals appearing at the coupling port 32 are routed by the circulator action to the output port 36 and thereafter to detector diode 22 by way of output matching network 20. While the preferred embodiment of the invention herein described utilizes a three port circulator, it should be understood that a four port circulator may also be used wherein the fourth port may be connected to a suitable signal absorbing load to attenuate any extraneous signals.

Figure 2:
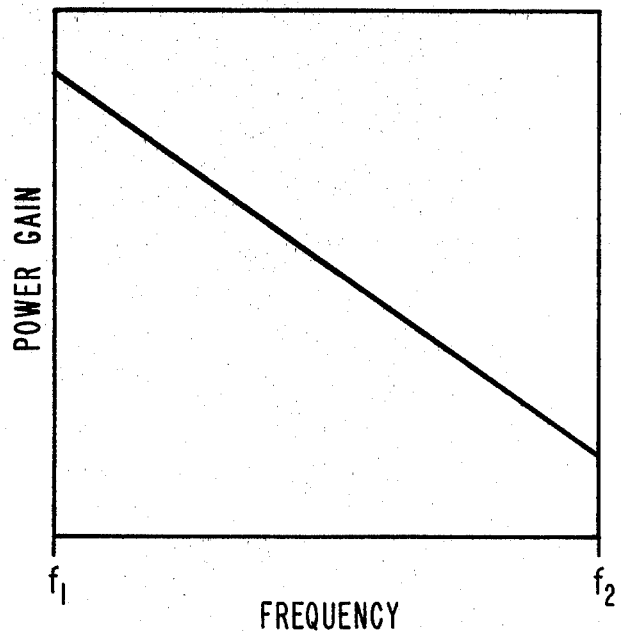
FIG. 2 is a graph showing power gain versus frequency used in describing the present invention.

According to the present invention, the input impedance matching network and output impedance matching network are formed to provide selected input and output impedance conditions to amplifier 14 such that the power-frequency response is substantially linear throughout the frequency band from $f_1$ to $f_2$ approximating a discriminator characteristic, as shown in FIG. 2.

Figure 3:
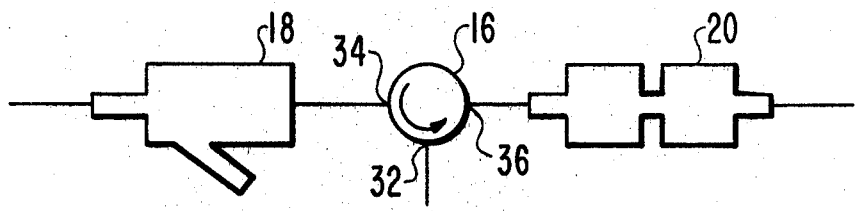
FIG. 3 is an illustration of a portion of a preferred embodiment of the invention in a microstrip circuit transmission line configuration.

In a preferred embodiment of the invention, active device amplifier 14, circulator 16, input network 18 and output network 20 are arranged in a microstrip circuit transmission line configuration although other circuits such as, for example, coaxial-line circuits, waveguide circuits and strip-line circuits may also be used. In the microstrip circuit form input and output networks 18 and 20 are conductive transmission line elements, the geometric shapes of which are varied to adjust the impedance conditions to achieve the desired linear discriminator characteristic. The topology of input network 18 and output network 20 for a selected frequency discriminator characteristic in a microstrip circuit form is shown, for example, in FIG. 3. The particular topology of these networks is determined by the impedance conditions required to substantially linearize the power-frequency response of amplifier 14. Variations in the network shapes change the impedance conditions to amplifier 14. The topology which provides the impedance conditions for a substantially linear power-frequency response is selected for a specific discriminator application. Selection of a desired topology and the design of input and output impedance matching networks may be facilitated by use of computer-aided analysis-optimization routines.

The RF signal 38 from output network 20 having a linear power-frequency relation is received by detector diode 22. RF signal 38 is demodulated by detector diode 22 and converted into a D.C. signal for subsequent processing (not shown). It is preferable that detector diode 22 be of the square law type. A square law detector has a characteristic $V_{out} = k\ V_{in}^2$, where $k$ is the detector sensitivity factor, such that the output D.C. voltage will vary substantially linearly as a function of the input RF power.

The microwave discriminator of the present invention as described herein achieves the desired frequency discriminator characteristic without the passive components of the prior art, which because of the double path structure and numerous interfaces, requires critical dynamic impedance matching. Due to the intrinsic gain, such a discriminator of the present invention provides for significantly higher sensitivity than the prior art devices, consequently broadening the operational bandwidth and substantially improving the resolution. Introduction of the circulator allows for utilization of single port active devices capable of operating at high microwave frequencies above 18 GHz. Furthermore, elimination of the passive components results in a decrease in size and a reduction in cost. Such a one port active device discriminator as described herein, including the active device amplifier with bias circuits, circulator, matching networks and detector diode may be fabricated on a single microwave integrated circuit (MIC) structure for improved performance and further size and cost reductions.

Although the invention can be used to scan for and detect signals of an unknown frequency in electronic counter measure (ECM) systems, the invention can also be used in scanning for frequency modulated signals. The detector output will generate a D.C. signal representing the modulating signal.

What is claimed is:

1. A microwave frequency discriminator comprising:
a one port active device amplifier including an active device, said active device being biased an amount for generating an output RF signal within a predetermined frequency bandwidth in response to an input RF signal of substantially constant power level;
means for coupling said input RF signal into said amplifier, and for coupling said ouput RF signal out from said amplifier;
input and output impedance matching means connected to said coupling means, said input and output matching means being formed to provide selected input and output impedance conditions to said amplifier such that the power of said output RF signal varies substantially linearly with the frequency of said input RF signal throughout said frequency bandwidth; and detector means responsive to said output RF signal for generating a D.C. signal varying substantially linearly as a function of the frequency of said input RF signal.

2. A microwave frequency discriminator according to claim 1, wherein said one port active device amplifier and said coupling means are formed of microstrip circuit transmission lines and wherein said input and output impedance matching means are microstrip circuit networks having a topology configured respectively to provide the selected input and output impedance conditions for linearizing the frequency response of said transistor amplifier.

3. A microwave frequency discriminator according to claim 1, wherein said detector means comprises a square law detector.

4. A microwave frequency discriminator according to claim 1, wherein said coupling means comprises a three port circulator having an input port, an output port and a coupling port, said coupling port being connected to said one port of said amplifier, said input port being connected to said input matching means and said output port being connected to said output matching means.

5. A microwave frequency discriminator comprising:

signal limiting means responsive to an input RF signal of varying power level for generating an RF signal of substantially constant power level;

a one port active device amplifier including an active device, said active device being biased an amount for generating an output RF signal within a predetermined frequency bandwidth in response to said RF signal of substantially constant power level;

means for coupling said RF signal of substantially constant power level into said amplifier, and for coupling said output RF signal out from said amplifier;

input and output impedance matching means connected to said coupling means, said input and output impedance matching means being formed to provide selected input and output impedance conditions to said amplifier such that the power of said output RF signal varies substantially linearly with the frequency of said input RF signal throughout said frequency bandwidth; and detector means responsive to said output RF signal for generating a D.C. signal varying substantially linearly as a function of the frequency of said input RF signal.

6. A microwave frequency discriminator according to claim 5, wherein said one port active device amplifier and said coupling means are formed of microstrip circuit transmission lines and wherein said input and output impedance matching means are microstrip circuit networks having a topology configured respectively to provide the selected input and output impedance conditions for linearizing the frequency response of said transistor amplifier.

7. A microwave frequency discriminator according to claim 5, wherein said detector means comprises a square law detector.

8. A microwave frequency discriminator according to claim 5, wherein said coupling means comprises a three port circulator having an input port, an output port and a coupling port, said coupling port being connected to said one port of said amplifier, said input port being connected to said input matching means and said output port being connected to said output matching means.

* * * * *